United States Patent [19]

Laub

[11] 3,835,409

[45] Sept. 10, 1974

[54] AMPLIFIER DISTORTION CIRCUIT FOR ELECTRIC GUITARS

[76] Inventor: William G. Laub, 920 Greenwood, Winnetka, Ill. 60093

[22] Filed: Sept. 25, 1973

[21] Appl. No.: 400,666

[52] U.S. Cl...................... 330/13, 84/1.11, 84/1.24, 330/149

[51] Int. Cl............................. H03f 3/18, G10h 1/06

[58] Field of Search ......... 84/1.11, 1.16, 1.19, 1.24; 330/13, 17, 149

[56] References Cited

FOREIGN PATENTS OR APPLICATIONS 651,354 10/1962 Canada .......................... 330/149 X

*Primary Examiner*—Herman Karl Saalbach
*Assistant Examiner*—Lawrence J. Dahl
*Attorney, Agent, or Firm*—Hill, Gross, Simpson, Van Santen, Steadman, Chiara & Simpson

[57] ABSTRACT

An amplifier for use with electric guitars for amplifying an electrical signal for application to a loudspeaker includes means for introducing crossover distortion in proportion to the amplitude of the electrical signal.

5 Claims, 7 Drawing Figures

AMPLIFIER DISTORTION CIRCUIT FOR ELECTRIC GUITARS

BACKGROUND

1. Field of the Invention

The present invention relates to amplifiers, and particularly to amplifiers intended for use with electric guitars or the like in which distortion is desired, to give a characteristic quality to the sound produced when a loudspeaker is used.

2. The Prior Art

In the past, vacuum tube amplifiers have been preferred for use with electric guitars and the like, because distortion which is naturally introduced by such an amplifier gives the sound a desired characteristic quality. It has heretofore been impractical to obtain distortion of the desired type with a transistor amplifier, because transistor amplifiers heretofore known either have substantially no distorting effect or the wrong kind of distortion to produce the desired sound quality. The advantages of transistorized circuitry, such as low volume packaging and cool operation, have not been available in such amplifiers.

SUMMARY OF THE INVENTION

It is a principal object of the present invention to provide a circuit for introducing the desired type of distortion in a transistor amplifier, thereby achieving the advantages of transistorized design without sacrificing the desired sound quality.

This and other objects and advantages of the present invention will become manifest upon an examination of the following description and the accompanying drawings.

In one embodiment of the present invention, there is provided a circuit for establishing a variable bias level to a complementary symmetry transistor amplifier or a quasi-complementary symmetry transistor amplifier, such circuit incorporating means for deriving a d.c. signal having a level proportional to the amplitude of the output signal, and means for applying the d.c. signal to bias the amplifier to produce crossover distortion in an amount proportional to the amplitude of the output signal.

BRIEF DESCRIPTION OF THE DRAWINGS

Reference will now be made to the accompanying drawings, in which.

DESCRIPTION OF THE PREFERRED EMBODIMENT

Figure 1:
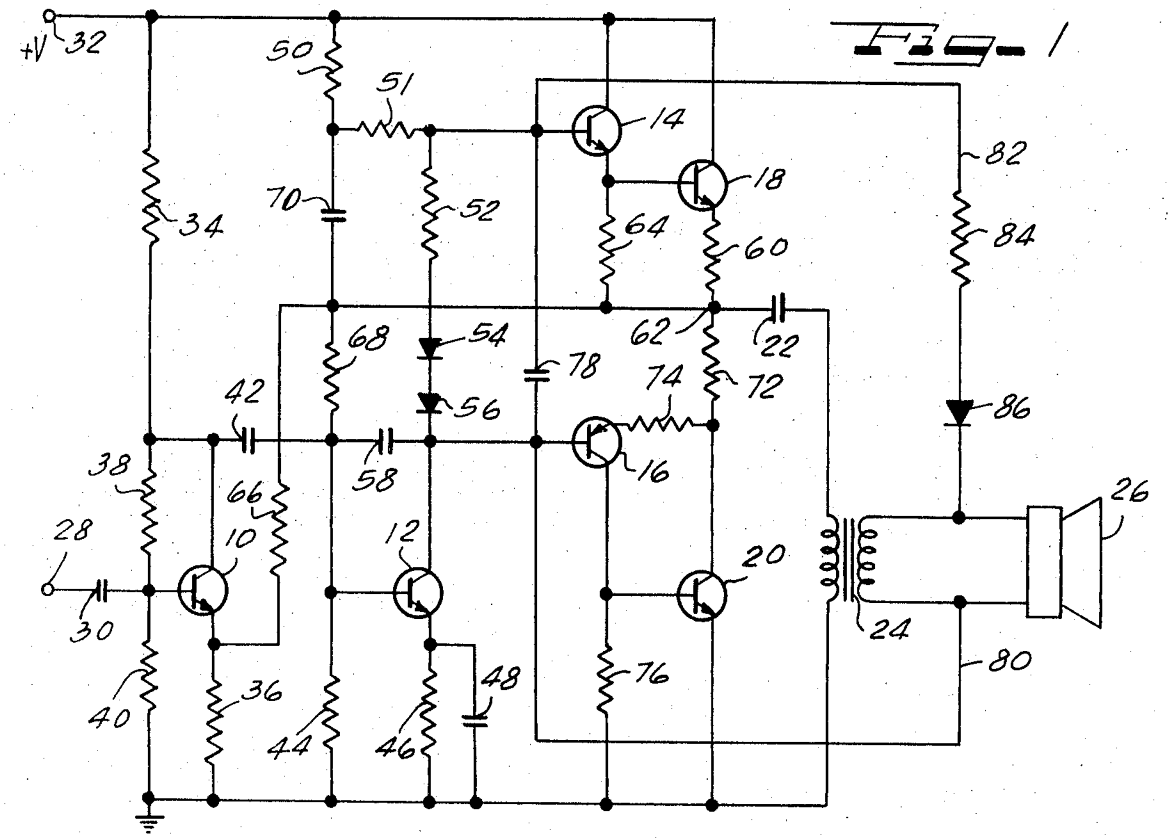
FIG. 1 is a schematic circuit diagram of a quasi-complementary symmetry amplifier incorporating an illustrative embodiment of the present invention.

Referring now to FIG. 1, a schematic circuit diagram of an amplifier incorporating an illustrative embodiment of the present invention is illustrated. The amplifier includes an input transistor 10, a transistor 12 connected thereto and functioning as a driver stage, and four output transistors 14, 16, 18, and 20 connected in quasi-complementary symmetry fashion, with the transistors 14 and 18 being connected as one Darlington pair and the transistors 16 and 20 being connected as a second Darlington pair. All of the transistors 10–20 are npn units except for transistor 16, which is chosen as a pnp unit, as in conventional quasi-complementary symmetry amplifiers. All of the transistors 10–20 are connected in their conventional fashion, and function to furnish an output signal which is applied through a coupling capacitor 22 to the primary winding of a transformer 24. The secondary winding of the transformer 24 is connected to the voice coil of a loudspeaker 26, so that the loudspeaker 26 functions to convert, into sound waves, the signals which are applied to the base of the input transistor 10 from an input terminal 28, through an input coupling capacitor 30.

The collector of the transistor 10 is connected to a source of positive potential at a terminal 32, through a resistor 34, and its emitter is connected to ground through a resistor 36. Bias is applied to the base of the transistor 10 through a voltage divider including transistors 38 and 40.

The collector of the transistor 10 is connected to the base of the transistor 12 through a capacitor 42. The base of the transistor 12 is also connected to ground through a resistor 44, and its emitter is connected to ground through a parallel circuit including a resistor 46 and a capacitor 48. Its collector is connected to the terminal 32 through resistors 50, 51, and 52, and through a pair of diodes 54 and 56, which are provided for establishing a predetermined voltage drop between the resistor 51 and the collector of the transistor 12. A capacitor 58 is connected between the collector and the base of the transistor 12.

The base of the transistor 14 is connected to the junction of the resistors 51 and 52, and its emitter is connected to the base of the transistor 18. A resistor 60 connects the emitter of the transistor 18 to a point 62 at which the output of the amplifier appears. A resistor 64 connects the emitter of the transistor 14 to the point 62. Feedback is provided to the transistors 10 and 12 by means of resistors 66 and 68, which respectively connect the point 62 to the emitter of the transistor 10 and to the base of the transistor 12. A capacitor 70 connects the point 62 to the junction between the resistors 50 and 51.

The collector of the transistor 12 is connected directly to the base of the transistor 16, which has its emitter connected through resistors 72 and 74 to the point 62. Its collector is connected to ground through a resistor 76. The base of the transistor 20 is connected directly to the collector of the transistor 16; its collector, to the junction of resistors 72 and 74; and its emitter, directly to ground.

The amplifier, as thus far described, is conventional and functions to amplify the signal applied to the input terminal 28 and to produce sound waves corresponding thereto at the loudspeaker 26. The circuit including the diodes 54 and 56 establishes a predetermined voltage difference between the base of the transistor 14 and the base of the transistor 16, so that both of these transistors are slightly conducting when no signal is applied to the input terminal 28. In this way, no offset distortion is introduced for low level signals. It is, however, desirable to introduce crossover distortion for high level signals in an amount proportional to the amplitude of the output signal in order to produce the desired sound quality, and the means for doing so will now be described.

A capacitor 78 is connected between the base of the transistor 14 and the base of the transistor 16. The capacitor 78 is charged at a rate proportional to the level of the output signal by means of a line 80 connecting the base of the transistor 16 with one terminal of the secondary of the transformer 24, and a line 82 which connects the other output terminal of the secondary of the transformer 24 to the base of the transistor 14, through a resistor 84 and a diode 86. The diode 86 insures that the capacitor 78 is charged in a single direction, that direction being such as to decrease the voltage difference between the bases of the transistors 14 and 16, and to increase the amount of offset distortion, in accordance with the amplitude of the signal present at the secondary of the transformer 24. The rate of charge is limited by the value of the resistor 84.

Figure 2:
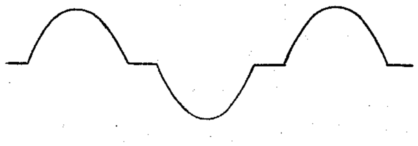
FIGS. 2–4 are waveforms of three different levels of output signal produced by a quasi-complementary symmetry transistor amplifier without compensation for crossover distortion.
Figure 3:
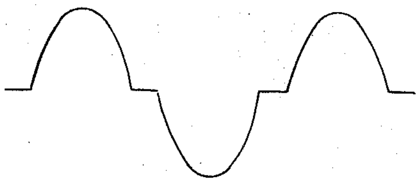
Figure 4:
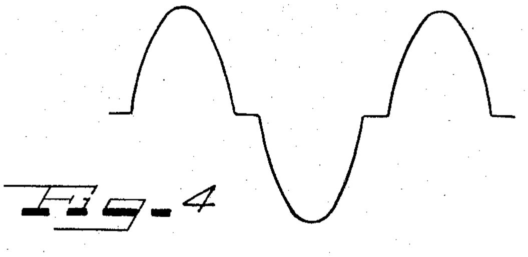

Referring to FIGS. 2, 3, and 4, the waveforms of small, medium, and large amplitude signals are illustrated for a transistor amplifier having no compensation for crossover distortion, such as one in which the capacitor 78 is short-circuited, for example. It can be seen in comparing the amount of offset between the positive-going and negative-going half-cycles of each waveform that these effects are approximately equal in duration, and do not increase from waveform as shown in FIG. 2 to FIG. 3 to FIG. 4 regardless of the amplitude of the amplified signal. This is a common condition of transistor amplifiers which are operated in Class B with inadequate compensation. It is not, however, the type of distortion which is desired for use with electric guitar amplifiers.

Figure 5:
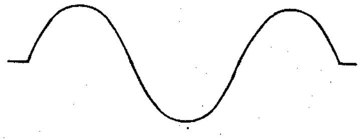
FIGS. 5–7 are waveform diagrams of three different levels of output signal produced in accordance with the present invention.
Figure 6:
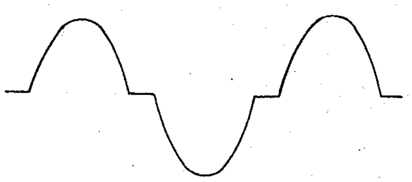
Figure 7:
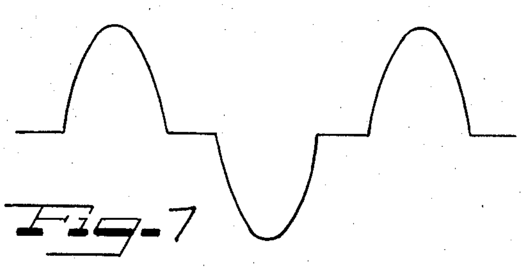

FIGS. 5–7 indicate output signals produced by the circuit of FIG. 1 for small, medium, and large amplitude signals, respectively. For small amplitude signals, as shown in FIG. 5, the output available at the secondary winding of the transformer 24 is relatively small, so that the rate of charging of the capacitor 78 through the resistor 84 is relatively slight and does not materially affect the bias levels established by the circuit including the diodes 54 and 56. Thus, there is no crossover distortion. For larger output signals, however, as shown in FIG. 6, the rate of charging is somewhat greater, resulting in a lesser potential difference across the capacitor 78, with the result that the bias potentials applied to the bases of the transistors 14 and 16 are closer together then they are for low level signals. For high level signals, as shown in FIG. 7, the rate of charging the capacitor 78 is even greater, bringing about a greater offset between successive half-cycles of the output waveform.

Although the present invention has been described in terms of a quasi-complementary symmetry amplifier, it will be apparent to those skilled in the art that the Darlington pairs may be replaced by single transistors of opposite conductivity types, to form a complementary symmetry amplifier, if desired.

As is apparent from the foregoing, an amplifier circuit incorporating the present invention achieves the characteristic of providing a crossover distortion proportional to the amplitude of the output signal, which is desirable for use with electric guitars and the like.

Various modifications and additions will be apparent to those skilled in the art, without departing from the essential features of novelty of the present invention, which are intended to be defined and secured only by the appended claims.

What is claimed is:

1. In a transistor amplifier having an output terminal and a pair of output transistors of opposite conductivity type connected to alternately supply output signals to said output terminal, a circuit for introducing crossover distortion increasingly as a function of the amplitude of the output signal comprising a capacitor connected between the inputs of the two output transistors, and means for charging the capacitor increasingly at a rate as a function of the amplitude of the output signals.

2. Apparatus according to claim 1, wherein said charging circuit comprises a series circuit including a resistor and a diode.

3. Apparatus according to claim 1, including an output transformer having its primary connected to said output terminal, and means for connecting the secondary of said transformer with the input terminals of said output transistors to establish a bias voltage therebetween which increases as a function of the amplitude of the signal present at said secondary.

4. Apparatus according to claim 3, wherein said charging circuit includes a series connected resistor and diode interconnecting said capacitor with said secondary.

5. Apparatus according to claim 1, including a circuit for establishing a quiescent bias level for said output transistors, said circuit including means for generating a quiescent potential difference between the inputs of said two output transistors, whereby the offset distortion produced by said amplifier is substantially reduced for low level and increased for higher signals applied to said inputs.

* * * * *